(12) United States Patent
Okutani et al.

(10) Patent No.: US 7,573,193 B2
(45) Date of Patent: Aug. 11, 2009

(54) OPTICAL DEVICE AND ORGANIC EL DISPLAY

(75) Inventors: Satoshi Okutani, Ishikawa-gun (JP); Tsuyoshi Uemura, Kanazawa (JP); Hirofumi Kubota, Kanazawa (JP); Naotada Okada, Yokohama (JP); Junichi Tonotani, Yokohama (JP); Keiji Suzuki, Yokohama (JP); Hideki Ookawa, Yokohama (JP)

(73) Assignees: Toshiba Matsushita Display Technology Co., Ltd., Tokyo (JP); Kabushiki Kaisha Toshiba, Tokyo (JP)

( * ) Notice: Subject to any disclaimer, the term of this patent is extended or adjusted under 35 U.S.C. 154(b) by 588 days.

(21) Appl. No.: 11/270,510

(22) Filed: Nov. 10, 2005

(65) Prior Publication Data

US 2006/0062270 A1    Mar. 23, 2006

Related U.S. Application Data

(63) Continuation of application No. PCT/JP2004/011615, filed on Aug. 12, 2004.

(30) Foreign Application Priority Data

Aug. 13, 2003    (JP)    ............................... 2003-293111

(51) Int. Cl.
*H05B 33/22*    (2006.01)
(52) U.S. Cl. ........................................ 313/504; 313/506
(58) Field of Classification Search ......... 313/498–512; 315/169.3; 345/36, 45, 76
See application file for complete search history.

(56) References Cited

U.S. PATENT DOCUMENTS 6,787,796 B2    9/2004    Do et al.

2003/0035978 A1*    2/2003    Raychaudhuri et al. ..... 428/690
2003/0062520 A1    4/2003    Toguchi et al.
2004/0017153 A1*    1/2004    Nishikawa .................. 313/506
2006/0062270 A1    3/2006    Okutani et al.

FOREIGN PATENT DOCUMENTS

| CN | 1411325 A | 4/2003 |
|---|---|---|
| JP | 03-067203 | 3/1991 |
| JP | 4-328294 | 11/1992 |

(Continued)

OTHER PUBLICATIONS

U.S. Appl. No. 11/456,415, filed Jul. 10, 2006, Okutani, et al.

*Primary Examiner*—Mariceli Santiago
*Assistant Examiner*—Christopher M Raabe
(74) *Attorney, Agent, or Firm*—Oblon, Spivak, McClelland, Maier & Neustadt, P.C.

(57) ABSTRACT

An optical device includes a first waveguide layer in which multiple-beam interference occurs, a second waveguide layer which includes a back surface facing the first waveguide layer and a front surface as a light output surface, and a diffraction grating which is arranged on a back side of the second waveguide layer and faces the first waveguide layer, wherein a grating constant of the diffraction grating is defined such that a first-order diffracted light emerges from the second waveguide layer, the first-order diffracted light being generated when a light component having a highest intensity of light which propagates in an in-plane direction while causing multiple reflection in the first waveguide layer enters the diffraction grating.

21 Claims, 5 Drawing Sheets

FOREIGN PATENT DOCUMENTS

| | | |
|---|---|---|
| JP | 11-283751 | 10/1999 |
| JP | 2000-284726 | 10/2000 |
| JP | 2001-291595 | 10/2001 |
| JP | 2003-109749 | 4/2003 |
| JP | 2003-115377 | 4/2003 |
| JP | 2003-140212 | 5/2003 |
| JP | 2003-163075 | 6/2003 |
| JP | 2003-257620 | 9/2003 |
| JP | 2004-296429 | 10/2004 |
| KR | 2003-0029467 | 4/2003 |

* cited by examiner

OPTICAL DEVICE AND ORGANIC EL DISPLAY

CROSS-REFERENCE TO RELATED APPLICATIONS

This is a Continuation Application of PCT Application No. PCT/JP2004/011615, filed Aug. 12, 2004, which was published under PCT Article 21(2) in Japanese.

This application is based upon and claims the benefit of priority from prior Japanese Patent Application No. 2003-293111, filed Aug. 13, 2003, the entire contents of which are incorporated herein by reference.

BACKGROUND OF THE INVENTION

1. Field of the Invention

The present invention relates to an optical device such as an organic EL (electroluminescent) display.

2. Description of the Related Art

Since organic EL displays are of self-emission type, they have a wide viewing angle and a high response speed. Further, they do not require a backlight, and therefore, low profile and light weight are possible. For these reasons, the organic EL displays are attracting attention as a display which replaces the liquid crystal display.

An organic EL element, which is the main part of the organic EL displays, includes a light transmitting front electrode, a light reflecting or light transmitting back electrode facing the front electrode, and an organic layer interposed between the electrodes and containing a light emitting layer. The organic EL element is a charge-injection type light emitting element which emits light when an electric current flows through the organic layer.

In order to display an image on an organic EL display, it is necessary that light emitted from its emitting layer be output from the front electrode. However, of the light travels toward the front side in the element, the portion which travels in a wide-angle direction is totally reflected on the interface of the front electrode. For this reason, a great portion of the light emitted by the organic layer cannot go out of the organic EL element.

As illustrated with the organic EL display, displays in which each pixel has a light emitting element entail the drawback in which the outcoupling efficiency of the light emitting element is not sufficient. In addition, in achieving the present invention, the present inventors have found that the luminous efficiency of such a display is greatly influenced by not only the outcoupling efficiency of the light emitting element, but also other factors.

BRIEF SUMMARY OF THE INVENTION

It is an object of the present invention to increase the luminous efficiency of an optical device such as an organic EL display.

According to a first aspect of the present invention, there is provided an optical device comprising a first waveguide layer in which multiple-beam interference occurs, a second waveguide layer which comprises a back surface facing the first waveguide layer and a front surface as a light output surface, and a diffraction grating which is disposed on a back side of the second waveguide layer and faces the first waveguide layer, wherein a grating constant of the diffraction grating is defined such that a first-order diffracted light emerges from the second waveguide layer, the first-order diffracted light being generated when a light component having a highest intensity of light which propagates in an in-plane direction while causing multiple reflection in the first waveguide layer enters the diffraction grating.

According to a second aspect of the present invention, there is provided an optical device comprising a light-emitting element which comprises a front electrode, a back electrode facing the front electrode, and a photo-active layer interposed between the front electrode and the back electrode and including an emitting layer, a light transmitting insulating layer which comprises a back surface facing the front electrode and a front surface as a light output surface, and a diffraction grating which is disposed on a back side of the insulating layer and faces the light-emitting element, wherein a grating constant of the diffraction grating is defined such that a first-order diffracted light emerges from the insulating layer, the first-order diffracted light being generated when a light component having a highest intensity of light which is emitted from the light-emitting element and propagates in an in-plane direction while causing multiple reflection on the back side of the insulating layer enters the diffraction grating.

According to a third aspect of the present invention, there is provided an organic EL display comprising an organic EL element which comprises a front electrode, a back electrode facing the front electrode, and an organic layer interposed between the front electrode and the back electrode and including a light-emitting layer, a light transmitting insulating layer which includes a back surface facing the front electrode and a front surface as a light output surface, and a diffraction grating which is disposed on a back side of the insulating layer and faces the organic EL element, wherein a grating constant of the diffraction grating is defined such that a first-order diffracted light emerges from the insulating layer, the first-order diffracted light being generated when a light component having a highest intensity of light which is emitted from the organic EL element and propagates in an in-plane direction while causing multiple reflection on the back side of the insulating layer enters the diffraction grating.

According to a fourth aspect of the present invention, there is provided an optical device comprising a first waveguide layer in which light propagates, a second waveguide layer which includes a back surface facing the first waveguide layer and a front surface as a light output surface, and a diffraction grating which is disposed on the back side of the second waveguide layer and faces the first waveguide layer, wherein a grating constant of the diffraction grating is defined such that total reflection of light which emerges from the first waveguide layer and enters the second waveguide layer on the front surface of the second waveguide layer is suppressed.

DETAILED DESCRIPTION OF THE INVENTION

Embodiments of the present invention will be described below with reference to the accompanying drawings. The same reference numerals denote elements having the same or similar functions throughout the drawings, and a repetitive description thereof will be omitted.

Figure 1:
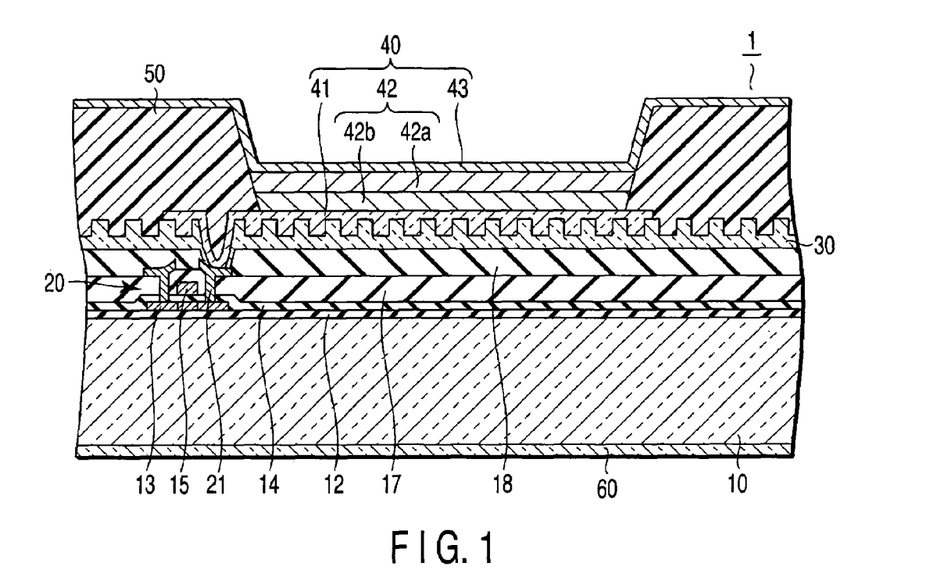
FIG. 1 is a partial sectional view schematically showing an organic EL display according to the first embodiment of the present invention.

FIG. 1 is a partial sectional view schematically showing an optical device according to the first embodiment of the present invention. FIG. 1 illustrates a self-emission display and, more specifically, an organic EL display 1 as an example of the optical device. Referring to FIG. 1, the display surface, i.e., the front surface of the organic EL display 1 is directed downward, and the back surface is directed upward.

The organic EL display 1 is a bottom emission type organic EL display which employs an active matrix drive method. The organic EL display 1 includes a transparent substrate 10 such as a glass substrate as an insulating layer with light transmission property.

On the transparent substrate 10, pixels are arranged in a matrix form. Each pixel includes, for example, an element control circuit (not shown), an output switch 20, an organic EL element 40, which are connected in series between a pair of power source terminals, and a pixel switch (not shown). The control terminal of the element control circuit is connected to a video signal line (not shown) via the pixel switch. The element control circuit 20 outputs a current, which has a magnitude corresponding to a video signal supplied from the video signal line, through the output switch 20 to the organic EL element 40. The control terminal of the pixel switch is connected to a scan signal line (not shown), and the ON/OFF operation thereof is controlled in accordance with a scan signal supplied from the scan signal line. Note that other structures can be employed for the pixels.

On the substrate 10, as an undercoat layer 12, for example, an $SiN_x$ layer and an $SiO_x$ layer are arranged in this order. A semiconductor layer 13 such as a polysilicon layer in which a channel, source and drain are formed, a gate insulator 14 which can be formed with use of, for example, TEOS (tetraethyel orthosilicate), and a gate electrode 15 made of, for example, MoW, are arranged in this order on the undercoat layer 12, and these layers form a top gate-type thin film transistor (referred to as a TFT hereinafter). In this example, the TFTs are used as TFTs of the pixel switch, output switch 20 and element control circuit. Further, on the gate insulator 14, scan signal lines (not shown) which can be formed in the same step as that for the gate electrode 15 are arranged.

An interlayer insulating film 17 made of, for example, $SiO_x$ which is deposited by a plasma CVD method, is arranged on the gate insulator 14 and gate electrode 15. Source and drain electrodes 21 are arranged on the interlayer insulating film 17, and they are buried in a passivation film 18 made of, for example, $SiN_x$. The source and drain electrodes 21 have a three-layer structure of, for example, Mo/Al/Mo, and electrically connected to the source and drain of the TFT via a contact hole formed in the interlayer insulating film 17. Further, on the interlayer insulating film 17, video signal lines (not shown) which can be formed in the same step as that for the source and drain electrodes 21 are arranged.

A diffraction grating 30 is formed on the passivation film 18. For example, the diffraction grating 30 has a predetermined pattern of recessed portions on its surface on the first waveguide layer's side, i.e., the surface in contact with the organic EL element 40. In addition, the diffraction grating 30 is made of a material having an optical property different from that of the first waveguide layer. An organic insulating material such as a resist or polyimide can be used for the diffraction grating 30. The pattern to be formed on the surface of the diffraction grating 30 can variously be designed to, e.g., a stripe or grid shape. Alternatively, as the diffraction grating 30, an insulating layer having through holes or recessed portions may be used. For example, the diffraction grating 30 may include a first portion having recessed portions or through holes and a second portion which buries the recessed portions or through holes of the first portion and has an optical property different from that of the first portion. A through hole which communicates with the drain electrode 21 is formed in the passivation film 18 and diffraction grating 30.

Front electrodes 41 with a light transmission property are juxtaposed on the diffraction grating 30 while being spaced apart from one another. In this example, the front electrode 41 serves as an anode and is made of a transparent conductive oxide such as indium tin oxide (ITO). The front electrode 41 is electrically connected to the drain electrode 21 via the through hole formed in the passivation film 18 and diffraction grating 30.

A partition insulating layer 50 is also formed on the diffraction grating 30. A through hole is formed in the partition insulating layer 50 at a position corresponding to the front electrode 41. The partition insulating layer 50 is, e.g., an organic insulating layer and can be formed by using photolithography.

On the portion of the front electrode 41 which is exposed to the inside of the through hole of the partition insulating layer 50, an organic layer 42 which includes a light emitting layer 42a is arranged. The light-emitting layer 42a is, e.g., a thin film containing a luminescent organic compound which emits red, green, or blue light. The organic layer 42 can also include a layer other than the light-emitting layer 42a. For example, the organic layer 42 can also include a buffer layer 42b which serves to mediate hole injection from the front electrode 41 to the light-emitting layer 42a. The organic layer 42 can also include a hole transporting layer, hole blocking layer, electron transporting layer, and electron injection layer, etc.

A back electrode 43 with light-reflection property is arranged on the partition insulating layer 50 and organic layer 42. In this example, the back electrode 43 is a cathode continuously formed to be common to all pixels. The back electrode 43 is electrically connected, via a contact hole (not shown) formed in the diffraction grating 30 and partition insulating layer 50, to an electrode interconnection formed on the same layer as that the video signal line is formed on. Each organic EL element 40 includes the front electrode 41, organic layer 42, and back electrode 43.

Normally, the organic EL display 1 shown in FIG. 1 further includes a sealing substrate (not shown) facing the back electrode 43 and a seal layer (not shown) arranged along the periphery of the surface of the sealing substrate which faces back electrode 43. With this structure, an enclosed space is formed between the back electrode 43 and the sealing substrate. This space can be filled with, e.g., a rare gas such as Ar gas or an inert gas such as $N_2$ gas.

The organic EL display 1 further includes a light scattering layer 60 outside the transparent substrate 10, i.e., on the front side. A polarizer may be arranged between the transparent substrate 10 and the light scattering layer 60. A neutral-density (ND) filter may be arranged on the light scattering layer 60.

The present inventors found the following facts as a result of extensive research to increase the luminous efficiency of the organic EL display.

The luminous efficiency of the organic EL display depends on not only the outcoupling efficiency of the light-emitting element but also other factors. More specifically, even when light can efficiently be output from the organic EL element, the luminous efficiency of the organic EL display cannot be sufficiently high unless the light can be output from the light transmitting insulating layer arranged on the front side with respect to the organic EL element. In other words, to sufficiently increase the luminous efficiency of the organic EL display, total reflection of light, which has entered the light transmitting insulating layer, by the interface between the light transmitting insulating layer and the exterior (typically, air) must sufficiently be suppressed. That is, it is important to suppress total reflection of light, which has entered from the first waveguide layer (in this case, the laminate of the front electrode 41 and organic layer 42) to the second waveguide layer (in this case, the light transmitting insulating layer such as the substrate 10), by the light output surface of the second waveguide layer.

According to examinations by the present inventors, to sufficiently suppress total reflection of light, which has entered the light transmitting insulating layer, by the interface between the light transmitting insulating layer and the exterior, the light which enters the light transmitting insulating layer must have an angle within the critical angle between the light transmitting insulating layer and the exterior and a very high directivity. More specifically, the directivity of light must be so increased that the light scattering layer must be used to implement a sufficient view angle. Hence, to sufficiently increase the directivity of light which should enter the light transmitting insulating layer by using the diffraction grating, the grating constant must be set very small.

Note that the light-emitting layer of the organic EL element emits light in all directions. Therefore, it is originally not necessary to arrange a light scattering layer to achieve a wide viewing angle in organic EL displays. Based on such a background, the conventional organic EL displays do not use a light scattering layer or output light with a high directivity from a light transmitting insulating layer arranged on an observer side with regard to the organic EL element.

Further, the present inventors have found that multiple reflection and multiple interference, that is, "multiple-beam interference" need be considered. The "multiple-beam interference" is an interference which occurs as some of light rays are repeatedly reflected between reflecting surfaces, that is, parallel plane-like reflecting surfaces.

Multiple-beam interference occurs in a very thin layer such as the laminate of the front electrode 41 and organic layer 42. Of the light which travels within the laminate, a light beam which travels in a certain direction is enhanced, whereas a light beam which travels in another direction is weakened. In other words, the traveling direction of the light which propagates in an in-plane direction while repeatedly reflected between both main surfaces of the laminate is regulated. Therefore, of the lights which propagate in the in-plane direction while repeatedly reflected in the above described laminate, the light with the maximum intensity is particularly important to effectively utilize in order to improve the luminous efficiency of the organic EL display.

Figure 2:
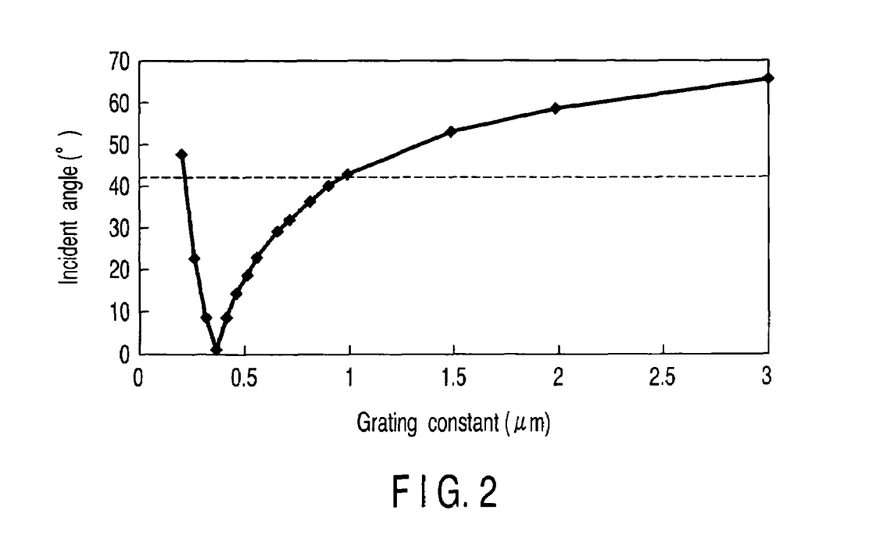
FIG. 2 is a graph showing the relationship between the grating constant of a diffraction grating and the incident angle of first-order diffracted light on the interface between the transparent substrate and the exterior, which is obtained for the organic EL display shown in FIG. 1.

FIG. 2 is a graph showing the relationship between the grating constant of the diffraction grating 30 and the incident angle of first-order diffracted light on the interface between the transparent substrate 10 and the exterior, which is obtained for the organic EL display 1 shown in FIG. 1. Referring to FIG. 2, the abscissa represents the grating constant of the diffraction grating 30, and the ordinate represents the incident angle of first-order diffracted light on the interface between the transparent substrate 10 and the exterior.

The data shown in FIG. 2 was obtained by executing simulation under the following conditions. The thickness of the laminate of the organic layer 42 and front electrode 41 was 150 nm. The refractive index of the laminate was 1.55. The organic layer 42 emitted light having a wavelength of 530 nm. A glass substrate was used as the transparent substrate 10. The critical angle for light which travels from the inside of the transparent substrate 10 to the exterior (air) was 41.3°.

Moreover, the multiple-beam interference in the laminate of the front electrode 41 and the organic layer 42 is considered, and, of the lights which propagate in the in-plane direction in the laminate, the light with the maximum intensity was used to calculate the diffraction by the diffraction grating 30. More specifically, based on the wavelength, thickness and refractive index of the laminate, of the lights which propagate in the in-plane direction in the laminate, the light with the maximum intensity was supposed to travel in a direction which made an angle of 63.7° with respect to the film surface, and the diffraction of the light by the diffraction grating 30 was calculated. Further, since the traveling direction of the 0-order diffracted light was not changed and the diffracted light of a higher order than that of the first-order diffracted light was very weak, only the first-order diffracted light was considered here.

As shown in FIG. 2, in the case where the grating constant is greater than about 1 μm, the incident angle of the first-order diffracted light against the interface between the transparent substrate 10 and the exterior is equal to or greater than the critical angle. Therefore, in this case, the first-order diffracted light cannot be utilized for display.

In the case where the grating constant is in a range from about 1 μm to about 0.2 μm, the incident angle of the first-order diffracted light against the interface between the transparent substrate 10 and the exterior is smaller than the critical angle. In particular, when the grating constant is set in a range larger than 0.2 μm and less than 0.4 μm, the incident angle can be reduced to an extremely small value. When the grating constant is set to about 0.35 μm, the incident angle can be set to 0°.

Note that, in the case where the grating constant is less than about 0.2 μm, the incident angle of the first-order diffracted light against the interface between the transparent substrate 10 and the exterior is equal to or greater than the critical angle. Therefore, in this case, the first-order diffracted light cannot be utilized for display.

As described, in the case where the grating constant of the diffraction grating is appropriately set, the incident angle of the first-order diffracted light against the interface between the transparent substrate 10 and the exterior can be made extremely small. In this case, of the lights which propagate in the film surface direction in the laminate, not only the light with the maximum intensity but also most of the lights with a lower intensity can have an incident angle smaller than the critical angle. Therefore, a great portion of the lights incident on the transparent substrate 10, which is a light transmitting insulating layer, can be output to the exterior. In other words, according to the organic EL display 1, a high luminous efficiency can be realized.

With this technique, the directivity of the light output from the transparent substrate 10 is significantly enhanced as described above. The directivity of the light can be freely changed with use of the light scattering layer 60 in accordance with the usage of the organic EL display 1. For example, in the case where the organic EL display 1 is used in a mobile device such as a mobile telephone, the organic EL display 1 is not required to have a wide viewing angle, but it requires to have a bright display or a low power consumption. Therefore, for this particular usage, a light scattering layer 60 which has a low light scattering capability may be used. On the other hand, in the case where the organic EL display 1 is utilized as a display for a stationary device, the organic EL display 1 is required to have a wide viewing angle. Therefore, for this particular usage, a light scattering layer 60 which has a high light scattering capability may be used.

The relationship between the grating constant of the diffraction grating 30 and the incident angle of first-order diffracted light on the interface between the transparent substrate 10 and the exterior, which has been described with reference to FIG. 2, changes depending on the refractive index of the laminate of the organic layer 42 and front electrode 41 or the wavelength of light emitted from the organic EL element 40. This will be described with reference to FIGS. 3 to 6.

Figure 3:
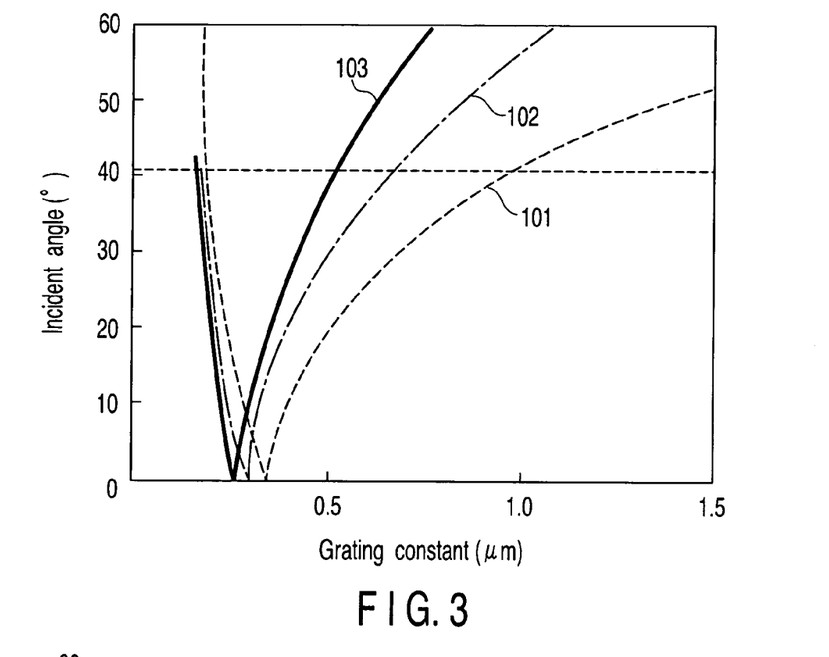
FIG. 3 is a graph showing the relationship between the grating constant of the diffraction grating and the refractive index of the laminate of the organic layer and front electrode, which is obtained for the organic EL display shown in FIG. 1.

FIG. 3 is a graph showing the relationship between the grating constant of the diffraction grating 30 and the refractive index of the laminate of the organic layer 42 and front electrode 41, which is obtained for the organic EL display 1 shown in FIG. 1. Referring to FIG. 3, the abscissa represents the grating constant of the diffraction grating 30, and the ordinate represents the incident angle of first-order diffracted light on the interface between the transparent substrate 10 and the exterior. Referring to FIG. 3, a curve 101 indicates data obtained when the refractive index of the laminate of the organic layer 42 and front electrode 41 is 1.55 (=refractive index of glass). A curve 102 indicates data obtained when the refractive index of the laminate of the organic layer 42 and front electrode 41 is 1.80. A curve 103 indicates data obtained when the refractive index of the laminate of the organic layer 42 and front electrode 41 is 2.00 (=refractive index of ITO). The data shown in FIG. 3 were obtained by executing simulation under the same conditions as described with reference to FIG. 2 except that the refractive index of the laminate was changed as described above.

Assume that the organic EL element 40 emits light having a wavelength of 530 nm, and the grating constant of the diffraction grating 30 is 0.21 to 0.54 μm. As is apparent from FIG. 3, in this case, first-order diffracted light can be made to enter the transparent substrate 10, and at least some components of the light incident on the transparent substrate 10 can emerge to the exterior independently of which refractive index from 1.55 to 2.00 the laminate has.

Figure 4:
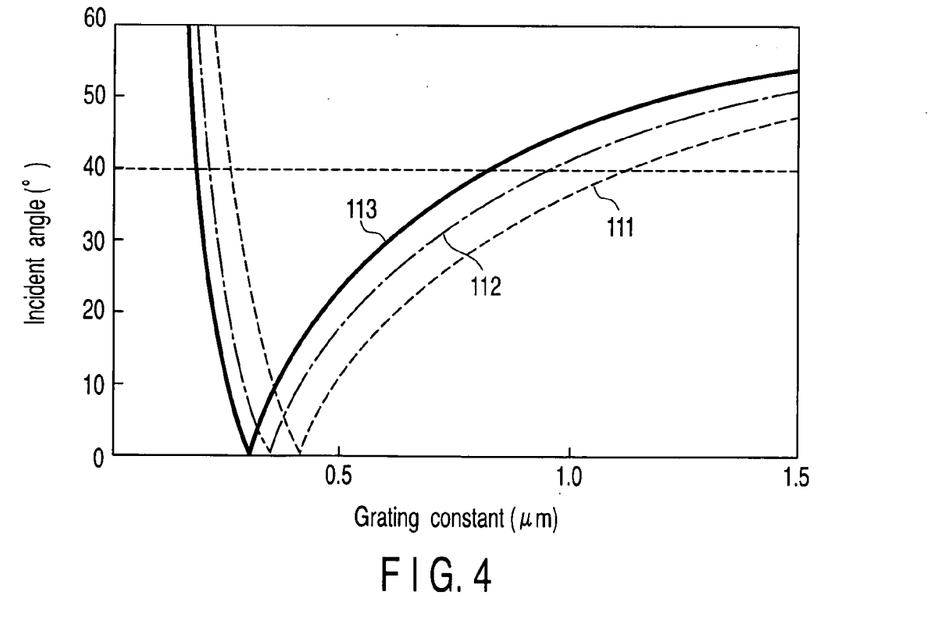
FIG. 4 is a graph showing an example of the relationship between the grating constant of the diffraction grating and the wavelength of light emitted from an organic EL element, which is obtained for the organic EL display shown in FIG. 1.
Figure 5:
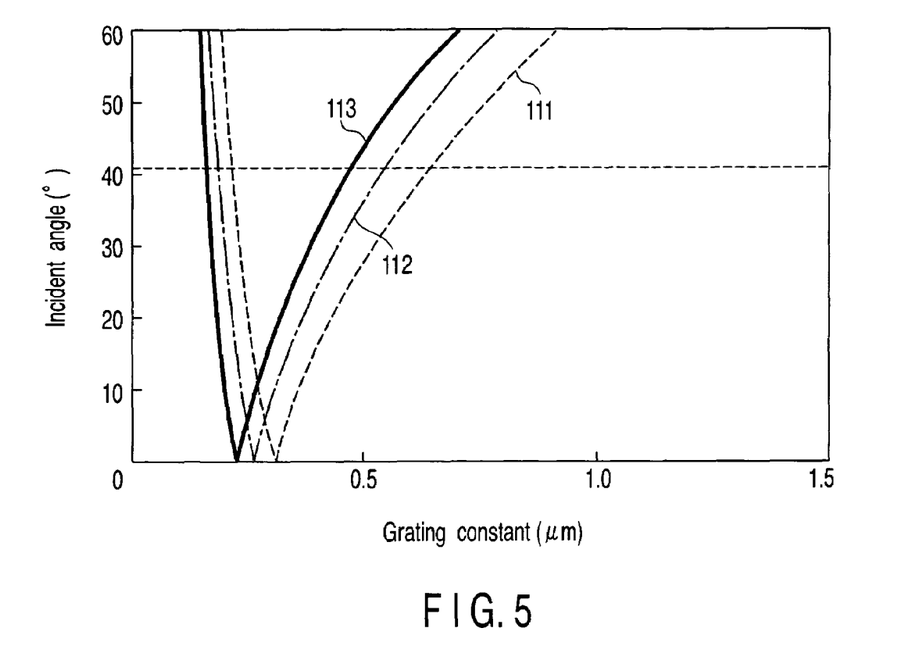
FIG. 5 is a graph showing another example of the relationship between the grating constant of the diffraction grating and the wavelength of light emitted from the organic EL element, which is obtained for the organic EL display shown in FIG. 1.

FIG. 4 is a graph showing an example of the relationship between the grating constant of the diffraction grating 30 and the wavelength of light emitted from the organic EL element 40, which is obtained for the organic EL display 1 shown in FIG. 1. FIG. 5 is a graph showing another example of the relationship between the grating constant of the diffraction grating 30 and the wavelength of light emitted from the organic EL element 40, which is obtained for the organic EL display 1 shown in FIG. 1.

Referring to FIGS. 4 and 5, the abscissa represents the grating constant of the diffraction grating 30, and the ordinate represents the incident angle of first-order diffracted light on the interface between the transparent substrate 10 and the exterior. Referring to FIGS. 4 and 5, a curve 111 indicates data obtained when the wavelength is 630 nm. A curve 112 indicates data obtained when the wavelength is 530 nm. A curve 113 indicates data obtained when the wavelength is 460 nm.

The data shown in FIG. 4 were obtained by executing simulation under the same conditions as described with reference to FIG. 2 except that the refractive index of the laminate of the organic layer 42 and front electrode 41 was set to 1.55, the wavelength of light emitted from the organic EL element 40 was changed as described above, and the traveling direction of light which propagated in the direction of film surface while repeating reflection between the major surfaces of the laminate was changed in accordance with the wavelength. The data shown in FIG. 5 were obtained by executing simulation under the same conditions as described with reference to FIG. 2 except that the refractive index of the laminate of the organic layer 42 and front electrode 41 was set to 2.00, the wavelength of light emitted from the organic EL element 30 was changed as described above, and the traveling direction of light which propagated in the direction of film surface while repeating reflection between the major surfaces of the laminate was changed in accordance with the wavelength.

For the organic EL element 40 which emits red light and, for example, light having a peak wavelength of about 630 nm, the grating constant of the diffraction grating 30 is set within the range of about 0.22 μm to about 1.15 μm. As is apparent from FIGS. 4 and 5, in this case, first-order diffracted light can be made to enter the transparent substrate 10, and at least some components of the light incident on the transparent substrate 10 can emerge to the exterior. Especially, when the grating constant of the diffraction grating 30 is set within the range of 0.27 μm to 0.65 μm, first-order diffracted light can be made to enter the second waveguide layer including the transparent substrate 10, and the light incident on the second waveguide layer can emerge to the exterior independently of the refractive index of the laminate (first waveguide layer) of the organic layer 42 and front electrode 41. For the organic EL element 40 which emits green light and, for example, light having a peak wavelength of about 530 nm, the grating constant of the diffraction grating 30 is set within the range of about 0.18 μm to about 0.95 μm. In this case, first-order diffracted light can be made to enter the transparent substrate 10, and at least some components of the light incident on the transparent substrate 10 can emerge to the exterior. Especially, when the grating constant of the diffraction grating 30 is set within the range of 0.21 μm to 0.57 μm, first-order diffracted light can be made to enter the second waveguide layer including the transparent substrate 10, and the light incident on the second waveguide layer can emerge to the exterior independently of the refractive index of the laminate (first waveguide layer) of the organic layer 42 and front electrode 41. For the organic EL element 40 which emits blue light and, for example, light having a peak wavelength of about 460 nm, the grating constant of the diffraction grating 30 is set within the range of about 0.16 μm to about 0.85 μm. In this case, first-order diffracted light can be made to enter the transparent substrate 10, and at least some components of the light incident on the transparent substrate 10 can emerge to the exterior. Especially, when the grating constant of the diffraction grating 30 is set within the range of 0.19 μm to 0.47 μm, first-order diffracted light can be made to enter the second waveguide layer including the transparent substrate 10, and the light incident on the second waveguide layer can emerge to the exterior independently of the refractive index of the laminate (first waveguide layer) of the organic layer 42 and front electrode 41. That is, light which enters from the first waveguide layer to the second waveguide layer can efficiently emerge from the light output surface of the second waveguide layer on the reverse side of the first waveguide layer.

Hence, when the grating constant of the diffraction grating 30 should be set to a predetermined value for all the organic EL elements 40 which emit red, green, and blue light, the grating constant of the diffraction grating 30 may be set within the range of about 0.27 μm to about 0.47 μm. In this case, for all display colors, first-order diffracted light can be made to enter the second waveguide layer including the transparent substrate 10, and the light incident on the second waveguide layer can emerge to the exterior through its exit surface.

When the grating constant of the diffraction grating 30 should be changed between the organic EL elements 40 which emit red, green, and blue light, the grating constant of the diffraction grating 30 may be set within the range of 0.22 μm to 1.15 μm at a portion facing the red organic EL element 40. The grating constant of the diffraction grating 30 may be set within the range of 0.18 μm to 0.95 μm at a portion facing the green organic EL element 40. The grating constant of the diffraction grating 30 may be set within the range of 0.16 μm to 0.85 μm at a portion facing the blue organic EL element 40. In this case, for all display colors, first-order diffracted light can be made to enter the transparent substrate 10, and at least some components of the light incident on the transparent substrate 10 can emerge to the exterior.

When the grating constant of the diffraction grating 30 should be changed between the organic EL elements 40 which emit red, green, and blue light, the grating constant of the diffraction grating 30 may be set within the range of 0.27 μm to 0.65 μm at a portion facing the red organic EL element 40. The grating constant of the diffraction grating 30 may be set within the range of 0.21 μm to 0.54 μm at a portion facing the green organic EL element 40. The grating constant of the diffraction grating 30 may be set within the range of 0.19 μm to 0.47 μm at a portion facing the blue organic EL element 40. In this case, for all display colors, first-order diffracted light can be made to enter the transparent substrate 10, and at least some components of the light incident on the transparent substrate 10 can emerge to the exterior independently of the refractive index of the first waveguide layer.

Figure 6:
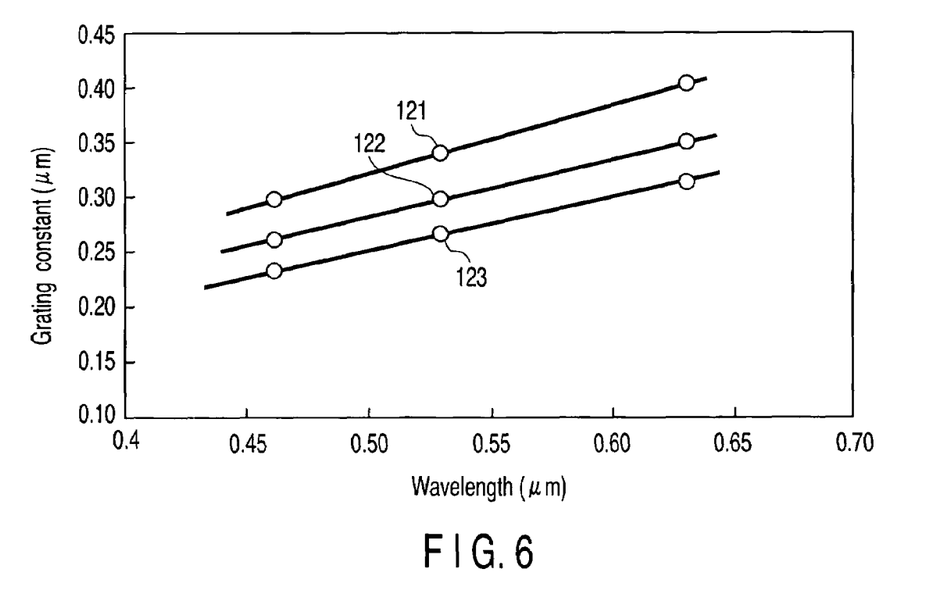
FIG. 6 is a graph showing a condition to set the incident angle of first-order diffracted light on the interface between the transparent substrate and the exterior to 0°.

FIG. 6 is a graph showing a condition to set the incident angle of first-order diffracted light on the interface between the transparent substrate 10 and the exterior to 0°. Referring to FIG. 6, the abscissa represents the wavelength of light emitted from the organic EL element 40, and the ordinate represents the grating constant of the diffraction grating 30 to set the incident angle of first-order diffracted light on the interface between the transparent substrate 10 and the exterior to 0°. Referring to FIG. 6, reference numeral 121 denotes data obtained when the refractive index of the laminate of the organic layer 42 and front electrode 41 is 1.55. Reference numeral 122 denotes data obtained when the refractive index of the laminate of the organic layer 42 and front electrode 41 is 1.80. Reference numeral 123 denotes data obtained when the refractive index of the laminate of the organic layer 42 and front electrode 41 is 2.00.

As shown in FIG. 6, the grating constant of the diffraction grating 30 which sets the incident angle of first-order diffracted light against the interface between the transparent substrate 10 and the exterior to 0° is not limited to 0.35. The grating constant changes in accordance with the refractive index of the laminate of the organic layer 42 and front electrode 41 or the wavelength of light emitted from the organic EL element 40.

In the example shown in FIG. 1, a light transmitting layer having a plurality of recessed portions is used as the diffraction grating 30. The diffraction grating 30 can employ any other structures.

Figure 7:
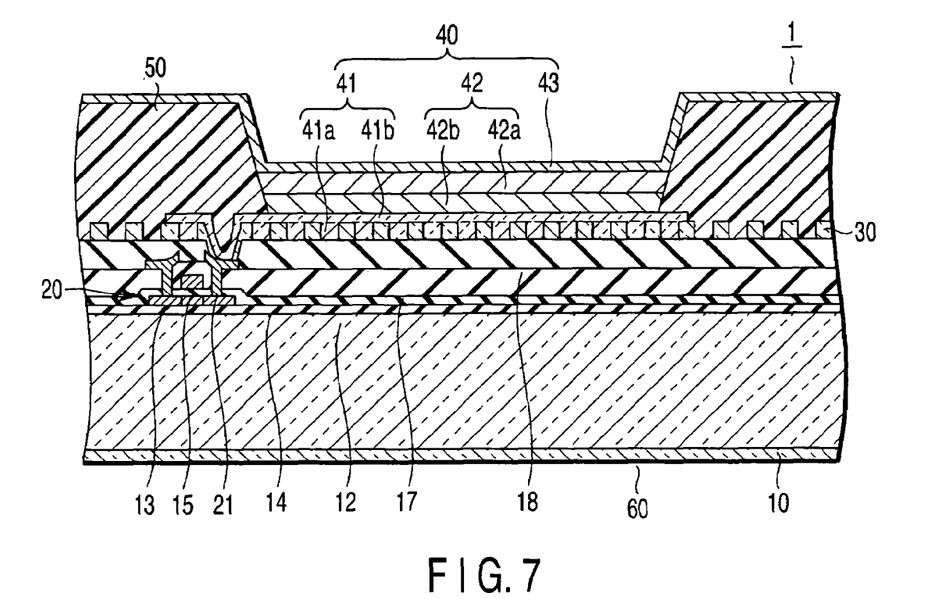
FIG. 7 is a partial sectional view schematically showing a modification of the organic EL display shown in FIG. 1.

FIG. 7 is a partial sectional view schematically showing a modification of the organic EL display shown in FIG. 1. The organic EL display 1 has the same structure as that of the organic EL display 1 shown in FIG. 1 except that a light transmitting layer having a plurality of through holes is used as the diffraction grating 30. In this way, the diffraction grating 30 can employ various structures.

The layers formed on the diffraction grating 30 can also employ various structures. For example, referring to FIG. 7, the portion which fills the through holes of the diffraction grating 30, i.e., a portion 41*a* may be made of a material different from a layer 41*b*.

The second embodiment of the present invention will be described next.

Figure 8:
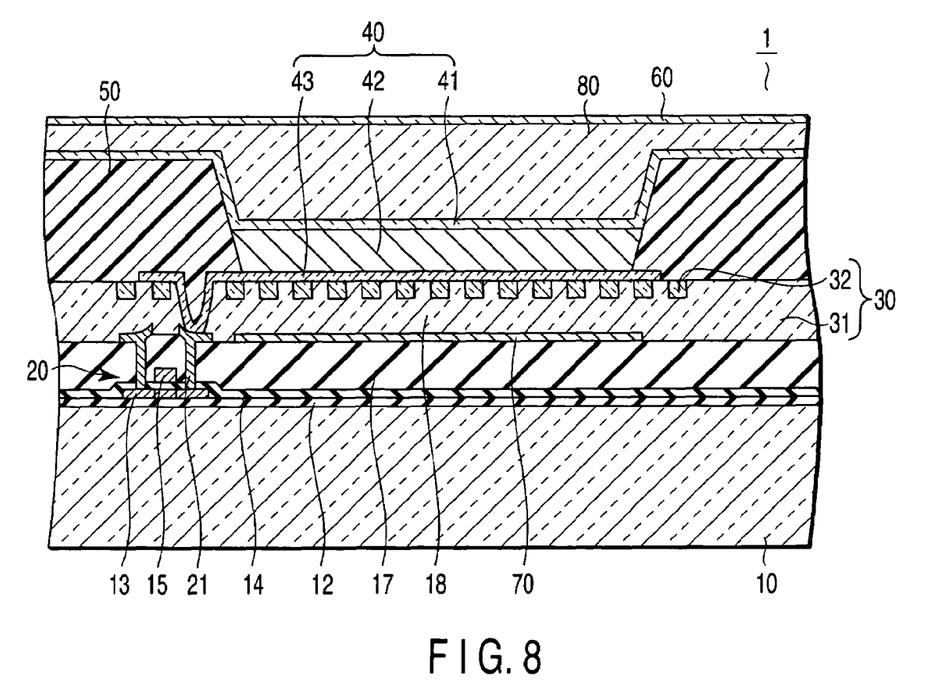
FIG. 8 is a sectional view schematically showing an organic EL display according to the second embodiment of the present invention.

FIG. 8 is a sectional view schematically showing an organic EL display according to the second embodiment of the present invention. FIG. 8 illustrates an organic EL display 1 with its front surface directed upward and its back surface directed downward.

The organic EL display 1 is a top emission type organic EL display. Hence, unlike the first embodiment, a substrate 10 need not have a light transmitting property.

As in the first embodiment, an undercoat layer 12, TFT, interlayer insulating film 17, and passivation film 18 are sequentially formed on the substrate 10. Contact holes are formed in a gate insulator 14 and the interlayer insulating film 17 and passivation film 18. Source and drain electrodes 21 are electrically connected to the source and drain of the TFT via the contact holes.

A reflecting layer 70 and a first portion 31 (integrated with the passivation film 18) of a diffraction grating 30 are sequentially formed on the interlayer insulating film 17. As the material of the reflecting layer 70., a metal material such as Al can be used. In this example, the reflecting layer 70 has a three-layered structure of Mo/Al/Mo so that it can be formed by the same process as the source and drain electrodes. As the material of the first portion 31, an insulating material such as SiN can be used.

The recessed portions of the first portion 31 are filled with second portions 32 made of a light transmitting insulating material such as a resist material having a refractive index higher than that of the first portion 31. That is, the refractive index is changed at the interface between the first portion 31 and the second portions 32. In addition, a periodical pattern is formed on the interface.

Back electrodes 43 with light transmitting property are juxtaposed on the diffraction grating 30 while being spaced apart from one another. In this example, the back electrode 43 serves as an anode and is made of a transparent conductive oxide such as ITO.

A partition insulating layer 50 which is the same as described in the first embodiment is also formed on the first portion 31 of the diffraction grating 30. An organic layer 42 including a light-emitting layer is formed on the back electrode 43 exposed to the inside of the through hole formed in the partition insulating layer 50, as in the first embodiment.

A front electrode 41 with light transmitting property is formed on the partition insulating layer 50 and organic layer 42. In this example, the front electrode 41 is a cathode continuously formed to be common to all pixels. In this example, an organic EL element 40 corresponds to the first waveguide layer.

A transparent protective film 80 as a light transmitting insulating layer and a light scattering layer 60 are sequentially formed on the front electrode 41. In this example, the transparent protective film 80 corresponds to the second waveguide layer. The transparent protective film 80 prevents inflow of water from the exterior into the organic EL element 40 and also serves as a flattening layer. As the material of the transparent protective film 80, a transparent resin can be used. The transparent protective film 80 can employ either a single-layered structure or a multilayered structure.

A polarizer may be arranged between the transparent protective film 80 and the light scattering layer 60. An ND filter may be arranged on the light scattering layer 60.

In the first embodiment, the diffraction grating 30 is arranged between the organic EL element 40 and the substrate 10 serving as the light transmitting insulating layer, i.e., on the front side of the organic EL element 40. In the second embodiment, the diffraction grating 30 is arranged between the organic EL element 40 and the reflecting layer 70, i.e., on the back side of the organic EL element 40. Even when this structure is employed, almost the same effect as described in the first embodiment can be obtained.

When the diffraction grating 30 is arranged on the back side of the organic EL element 40, some components of light emitted from the organic EL element 40 enter the light transmitting insulating layer without passing through the diffraction grating 30. Hence, to diffract more light components, it is advantageous to arrange the diffraction grating 30 between the organic EL element 40 and the light transmitting insulating layer.

In the example shown in FIG. 8, the diffraction grating 30 employs a structure in which the recessed portions of the first portion 31 are filled with the second portions 32. When the diffraction grating 30 includes the first portion 31 and second portions 32, any other structure can be employed.

Figure 9:
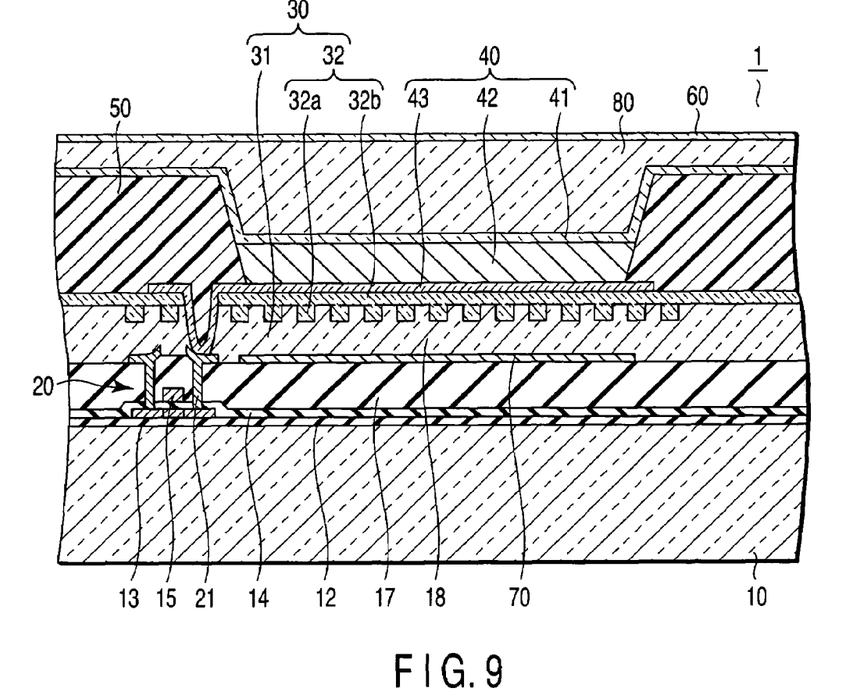
FIG. 9 is a sectional view schematically showing a modification of the organic EL display shown in FIG. 8.

FIG. 9 is a sectional view schematically showing a modification of the organic EL display shown in FIG. 8. In the organic EL display 1, the second portion 32 includes portions 32a which fill the recessed portions of the first portion 31 and a portion 32b which covers the upper surface of the first portion 31. Except these points, the organic EL display shown in FIG. 9 has the same structure as that of the organic EL display 1 shown in FIG. 8. In this way, the diffraction grating 30 can employ various structures.

In the first and second embodiments, as the diffraction grating 30, a one-dimensional lattice or a two-dimensional lattice may be used. In order to diffract more light, the latter is more advantageous.

In the first and second embodiments, a transmission-grating was used. Alternatively, a reflection-grating may be used. For example, the diffraction grating 30 shown in FIG. 8 may be omitted and projections and recesses that form a diffraction grating may be formed on the front surface of the reflection layer 70.

In the case where the diffraction grating 30 includes the light transmitting first portion 31 and the second portions 32 which fill the recesses formed in the first portion, the optical properties of the second portion 32 should be different from those of the first portion 31 as described above. It suffices if the first portion 31 and second portions 32 are different in at least one of the refractive index, transmittance and reflectance. Typically, the second portions 32 should be made light transmitting and have a different refractive index from that of the first portion 31.

The bottom surface of the recess formed in the first portion 31 may be the surface of the first portion 31, or it may be the surface of the underlying layer of the first portion 31. Further, the organic EL display 1 shown in FIG. 1 can be regarded to have such a structure that the diffraction grating 30 serves as the first portion shown in FIG. 8 and a part of the electrode 41 serves as the second portions 32 shown in FIG. 8. The second portions 32 may be made of a material different from that of the electrode 41 or 43.

At least one of the first portion 31 and second portions 32 included in the diffraction grating 30 may have a higher refractive index as compared to that of a layer adjacent thereto on the side of the organic EL element 40. With this structure, the multiple-beam interference in the layer located on the side of the organic EL element 40 with respect to the diffraction grating 30 is promoted.

As described above, the grating constant of the diffraction grating 30 used in the first and second embodiments is very small. That is, to obtain the organic EL displays 1 according to the first and second embodiments, a technique of forming a hyperfine pattern is necessary.

However, unlike the manufacture of a semiconductor device, a large-area substrate is used in manufacturing the organic EL display 1 in some cases. For this reason, in normal photography which uses a photomask, defocusing occurs due to warping of the substrate. It is therefore difficult to accurately transfer the pattern of the photomask. This problem can be solved by, e.g., using the following method.

Figure 10:
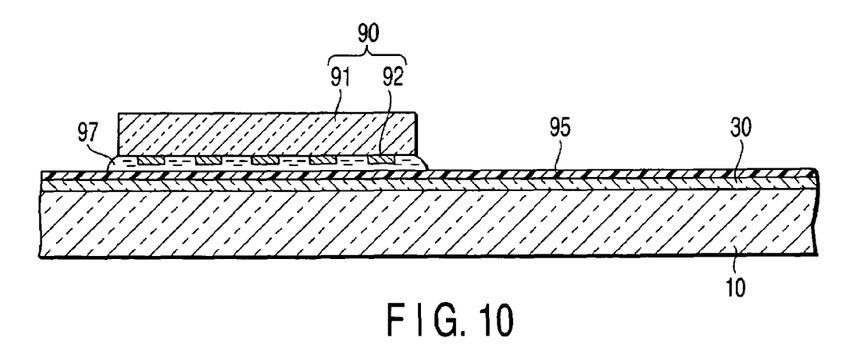
FIG. 10 is a sectional view schematically showing an example of a method of forming a diffraction grating.

FIG. 10 is a sectional view schematically showing an example of a method of forming the diffraction grating 30. Referring to FIG. 10, the constituent elements interposed between the substrate 10 and the diffraction grating 30 are omitted for the illustrative convenience. As an example, a method of forming the diffraction grating 30 shown in FIG. 1 will be described.

In this method, first, a continuous film 30 to be used as the diffraction grating 30 later is formed on an undercoat film such as the passivation film 18 formed on one major surface of the substrate 10. A resist film 95 is formed on the continuous film 30.

Next, a photomask 90 is prepared by forming a light-shielding pattern 92 on one major surface of a light transmitting substrate 91 made of, e.g., quartz. The photomask 90 is arranged such that the light-shielding pattern 92 faces the resist film 95 and the photomask 90 is in contact with the substrate 10 via a dielectric liquid film 97. The resist film 95 is exposed to light through the photomask 90 in this state.

The photomask 90 is removed from the substrate 10, and the resist film 95 is developed. With this process, a resist pattern (not shown) formed by patterning the resist film 95 is obtained.

The continuous film 30 is etched by using the resist pattern as a mask. By the above-described method, the diffraction grating 30 formed by patterning the continuous film 30 is obtained. Note that the diffraction grating 30 shown in FIG. 8 can be obtained by forming the first portion 31 in accordance with the same procedures as described above and, after that, filling the recessed portions with the second portions 32 made of a material with an optical property different from the first portion 31.

In this method, the photomask 90 and substrate 10 are arranged such that they are in contact with each other via the liquid film 97, as described above. For this reason, even when the substrate 10 is bent, a predetermined distance can be maintained between the light-shielding pattern 92 and the resist film 95. In addition, when the photomask 90 and substrate 10 are arranged such that they are in contact with each other via the liquid film 97, the distance between the light-shielding pattern 92 and the resist film 95 can be made less than the wavelength of exposure light. That is, exposure using near-field light can be executed. Furthermore, in this method, the pattern of the photomask 90 is transferred to the resist film 95 without enlarging it. Hence, according to this method, a diffraction grating 30 having an accurate grating constant can easily be formed.

In this method, the pattern of the photomask 90 is transferred to the resist film 95 without enlarging it, as described above. For this reason, normally, full plate exposure using the photomask 90 having a mother glass substrate size is not executed. Instead, step-and-repeat exposure using the photomask 90 having a smaller size is executed.

In this method, near-field light is used, as described above. Near-field light is non-propagating and is therefore unsuitable for exposure of the thick resist film 95. In forming a thick resist pattern, for example, a laminate of a thicker lower resist film and thinner upper resist film may be formed. More specifically, the upper resist film may be patterned by the above-described method using near-field light. The lower resist film may be patterned by dry etching (e.g., dry etching using plasma) using the resultant resist pattern as a mask. With this method, an accurate resist pattern which is resistant to an etchant to be used to pattern the continuous film 30 can be obtained.

In the above-described method, the resist pattern obtained by patterning the resist film 95 is used as the etching mask. The resist pattern itself may be used as the diffraction grating 30 or first portion 31.

As another forming method, the diffraction grating 30 can also be obtained by transferring (imprinting) a periodical pattern to the insulating layer by using a mold.

In the first and second embodiments, the arrangement is employed which can execute full-color display on the organic EL display 1 by using the organic EL elements 40 to emit light of different colors. However, the organic EL display 1 may employ an arrangement capable of monochrome display. Full-color display can be executed by employing another arrangement for the organic EL display 1. For example, full-color display may be implemented by using the organic EL elements 40 which emit white light and color filters. Alternatively, full-color display may be implemented by using the organic EL elements 40 which emit blue light and a color conversion filter. In the latter case the diffraction grating 30 is preferably arranged between the organic EL element 40 and the color conversion filter. When diffraction is caused in the monochrome light state, the wavelength dependence of the diffraction grating 30 need not be taken into consideration. That is, the grating constant of the diffraction grating 30 needs only be optimized only for the wavelength before color conversion. The grating constant of the diffraction grating 30 need not be optimized for each color.

In the first and second embodiments, the organic EL display 1 has been described as an example of a self-emission optical device. However, the above-described technique can also be applied to any other optical devices. For example, the above-described technique may be applied to a self-emission optical device such as an illumination device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An optical device comprising:
   a substrate;
   a light-emitting element configured to emit light and having a front electrode, a back electrode, and a photo-active layer, the back electrode being located above the substrate, the front electrode being located above the back electrode, and the photo-active layer being interposed between the front electrode and the back electrode and including an emitting layer;
   a light transmitting insulating layer located above the light-emitting element;
   a reflecting layer interposed between the light transmitting insulating layer and the substrate and spaced apart from the light-emitting element; and
   a diffraction grating interposed between the light transmitting insulating layer and the reflecting layer and facing the light-emitting element,
   wherein the diffraction grating has a grating constant such that a first-order diffracted light emerges from the light transmitting insulating layer, the first-order diffracted light being generated when a light component having a highest intensity of light which is emitted from the light-emitting element and propagates in an in-plane direction while causing multiple reflection in a region between the light transmitting insulating layer and the reflecting layer enters the diffraction grating.

2. The optical device according to claim 1, wherein the grating constant of the diffraction grating falls within a range of 0.16 μm to 1.15 μm.

3. The optical device according to claim 1, wherein the grating constant of the diffraction grating falls within a range of 0.27 μm to 0.47 μm.

4. The optical device according to claim 1, further comprising, as the light-emitting element, a red light-emitting element which emits red light, a green light-emitting element which emits green light, and a blue light-emitting element which emits blue light,
   wherein the diffraction grating has a grating constant within a range of 0.22 μm to 1.15 μm at a portion facing the red light-emitting element,
   the diffraction grating has a grating constant within a range of 0.18 μm to 0.95 μm at a portion facing the green light-emitting element, and
   the diffraction grating has a grating constant within a range of 0.16 μm to 0.85 μm at a portion facing the blue light-emitting element.

5. The optical device according to claim 1, further comprising, as the light-emitting element, a red light-emitting element which emits red light, a green light-emitting element which emits green light, and a blue light-emitting element which emits blue light,
   wherein the diffraction grating has a grating constant within a range of 0.27 μm to 0.65 μm at a portion facing the red light-emitting element,
   the diffraction grating has a grating constant within a range of 0.21 μm to 0.54 μm at a portion facing the green light-emitting element, and
   the diffraction grating has a grating constant within a range of 0.19 μm to 0.47 μm at a portion facing the blue light-emitting element.

6. The optical device according to claim 1, wherein the grating constant of the diffraction grating is defined such that an incident angle of the first-order diffracted light incident on the light transmitting insulating layer is equal to or less than 10°.

7. An organic EL display comprising:
a substrate;
an organic EL element configured to emit light and having a front electrode, a back electrode, and an organic layer, the back electrode being located above the substrate, the front electrode being located above the back electrode, and the organic layer being interposed between the front electrode and the back electrode and including a light-emitting layer;
a light transmitting insulating layer located above the organic EL element;
a reflecting layer interposed between the light transmitting insulating layer and the substrate and spaced apart from the organic EL element; and
a diffraction grating interposed between the light transmitting insulating layer and the reflecting layer and facing the organic EL element,
wherein the diffraction grating has a grating constant such that a first-order diffracted light emerges from the light transmitting insulating layer, the first-order diffracted light being generated when a light component having a highest intensity of light which is emitted from the organic EL element and propagates in an in-plane direction while causing multiple reflection in a region between the light transmitting insulating layer enters the diffraction grating.

8. The organic EL display according to claim 7, wherein the grating constant of the diffraction grating falls within a range of 0.16 μm to 1.15 μm.

9. The organic EL display according to claim 7, wherein the grating constant of the diffraction grating falls within a range of 0.27 μm to 0.47 μm.

10. The organic EL display according to claim 7, further comprising, as the organic EL element, a red organic EL element which emits red light, a green organic EL element which emits green light, and a blue organic EL element which emits blue light,
wherein the diffraction grating has a grating constant within a range of 0.22 μm to 1.15 μm at a portion facing the red organic EL element,
the diffraction grating has a grating constant within a range of 0.18 μm to 0.95 μm at a portion facing the green organic EL element, and
the diffraction grating has a grating constant within a range of 0.16 μm to 0.85 μm at a portion facing the blue organic EL element.

11. The organic EL display according to claim 7, further comprising, as the organic EL element, a red organic EL element which emits red light, a green organic EL element which emits green light, and a blue organic EL element which emits blue light,
wherein the diffraction grating has a grating constant within a range of 0.27 μm to 0.65 μm at a portion facing the red organic EL element,
the diffraction grating has a grating constant within a range of 0.21 μm to 0.54 μm at a portion facing the green organic EL element, and
the diffraction grating has a grating constant within a range of 0.19 μm to 0.47 μm at a portion facing the blue organic EL element.

12. The organic EL display according to claim 7, wherein the grating constant of the diffraction grating is defined such that an incident angle of the first-order diffracted light incident on the light transmitting insulating layer is equal to or less than 10°.

13. The organic EL display according to claim 7,
wherein the diffraction grating is arranged between the back electrode and the reflecting layer.

14. The organic EL display according to claim 7, wherein the light transmitting insulating layer includes a transparent protective film.

15. The organic EL display according to claim 7, wherein the organic EL display is of active matrix type.

16. The optical device according to claim 1, wherein the front and back electrodes are cathode and anode, respectively.

17. The organic EL display according to claim 7, wherein the front and back electrodes are cathode and anode, respectively.

18. An optical device comprising:
a substrate;
a transistor having a source and a drain and located above the substrate;
an interlayer insulating film covering the transistor and the substrate, the interlayer insulating film being provided with first and second through-holes;
source and drain electrodes electrically connected to the source and the drain through the first and second through-holes, respectively;
a diffraction grating located above the interlayer insulating film, the diffraction grating being provided with a third through-hole; and
a light-emitting element configured to emit light and having a first electrode, a second electrode, and a photo-active layer, the first electrode being located above the interlayer insulating film and electrically connected to the source or drain electrode through the third through-hole, the second electrode being located above the first electrode, and the photo-active layer being interposed between the first and second electrodes and including an emitting layer.

19. The optical device according to claim 18, wherein the first and second electrodes are front and back electrodes, respectively.

20. The optical device according to claim 18, further comprising a reflecting layer between the interlayer insulating film and the diffraction grating.

21. The optical device according to claim 19, wherein the front and back electrodes are cathode and anode, respectively.

* * * * *